United States Patent
Mikami et al.

(10) Patent No.: US 10,720,303 B2
(45) Date of Patent: Jul. 21, 2020

(54) CHARGED PARTICLE BEAM APPARATUS AND ALIGNMENT ADJUSTMENT METHOD OF SAMPLE STAGE

(71) Applicant: HITACHI HIGH-TECH CORPORATION, Minato-ku, Tokyo (JP)

(72) Inventors: Keisuke Mikami, Tokyo (JP); Toshiaki Nesaki, Tokyo (JP); Hiroyuki Chiba, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 15/753,703

(22) PCT Filed: Jul. 8, 2016

(86) PCT No.: PCT/JP2016/070204
§ 371 (c)(1),
(2) Date: Feb. 20, 2018

(87) PCT Pub. No.: WO2017/033591
PCT Pub. Date: Mar. 2, 2017

(65) Prior Publication Data
US 2018/0240641 A1 Aug. 23, 2018

(30) Foreign Application Priority Data
Aug. 21, 2015 (JP) .................................. 2015-163321

(51) Int. Cl.
*H01J 37/20* (2006.01)
*H01J 37/22* (2006.01)
(Continued)

(52) U.S. Cl.
CPC .............. *H01J 37/20* (2013.01); *H01J 37/22* (2013.01); *H01J 37/222* (2013.01); *H01J 37/24* (2013.01);
(Continued)

(58) Field of Classification Search
None
See application file for complete search history.

(56) References Cited

U.S. PATENT DOCUMENTS 6,872,955 B1 * 3/2005 Balcome ................ H01J 37/20
250/440.11
2004/0232332 A1 * 11/2004 Konno .................. H01J 37/265
250/310
(Continued)

FOREIGN PATENT DOCUMENTS

JP 08-162059 A 6/1996
JP 2003-207469 A 7/2003
(Continued)

OTHER PUBLICATIONS

JP2010198998 machine translation obtained from EPO website (Year: 2010).*
(Continued)

*Primary Examiner* — Michael J Logie
(74) *Attorney, Agent, or Firm* — Miles & Stockbridge, P.C.

(57) ABSTRACT

An object of the invention relates to the fact that the alignment of the sample stage and the optical image can be adjusted with high accuracy, good operability, and high throughput by utilizing a low magnification optical image and a high magnification optical image. The invention relates to the fact that an alignment adjustment by a sample table alignment can be performed using a first processed optical image obtained by enlarging or reducing or changing (Continued)

a visual field of the optical image of the sample table holding the sample by digital processing, and that an alignment adjustment by an alignment point designation can be performed using a second processed optical image different from the first processed optical image. According to the invention, it is possible to adjust the alignment of the sample stage and the optical image with reference to the outer shape of the sample table and the feature points on the sample without taking out the sample table holding the sample from the sample chamber.

10 Claims, 10 Drawing Sheets

(51) Int. Cl.
  *H01J 37/24* (2006.01)
  *H01J 37/28* (2006.01)
(52) U.S. Cl.
  CPC ......... *H01J 37/28* (2013.01); *H01J 2237/202* (2013.01); *H01J 2237/2007* (2013.01)

(56) References Cited

U.S. PATENT DOCUMENTS

| | | | |
|---|---|---|---|
| 2006/0171593 A1* | 8/2006 | Hayakawa | G06T 7/001 382/209 |
| 2007/0080291 A1* | 4/2007 | Buijsse | H01J 37/18 250/311 |
| 2012/0326033 A1* | 12/2012 | Shiono | H01J 37/228 250/310 |
| 2018/0088306 A1* | 3/2018 | Suzuki | G02B 21/34 |
| 2018/0108512 A1* | 4/2018 | Ishizawa | H01J 37/22 |

FOREIGN PATENT DOCUMENTS

| | | |
|---|---|---|
| JP | 2008-112596 A | 5/2008 |
| JP | 2010-198998 A | 9/2010 |
| JP | 2011-187192 A | 9/2011 |

OTHER PUBLICATIONS

Japanese Office Action dated Nov. 6, 2018 and Machine translation for Application No. 2017-536666.

* cited by examiner

[Fig. 1]
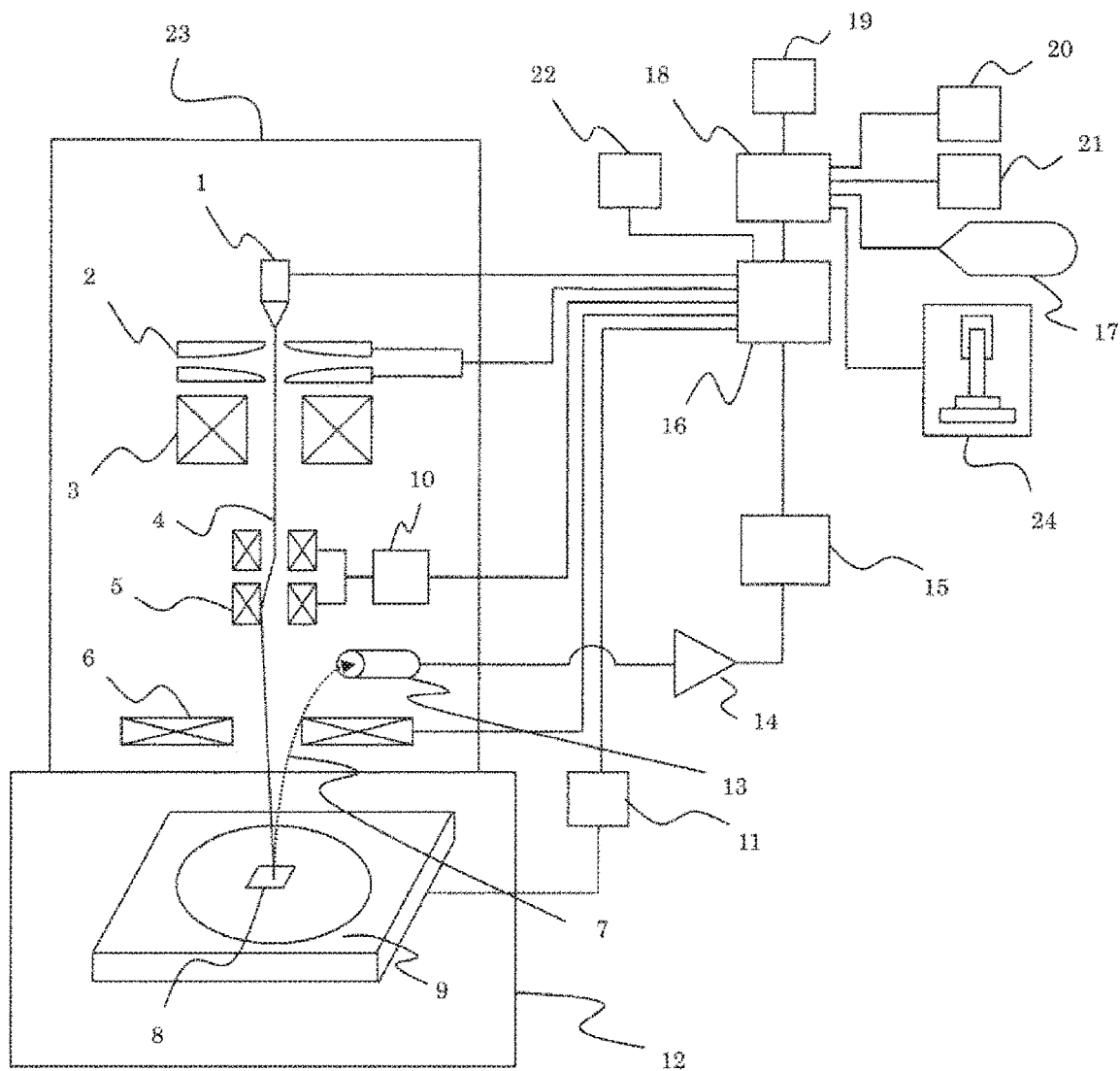

[Fig. 2]
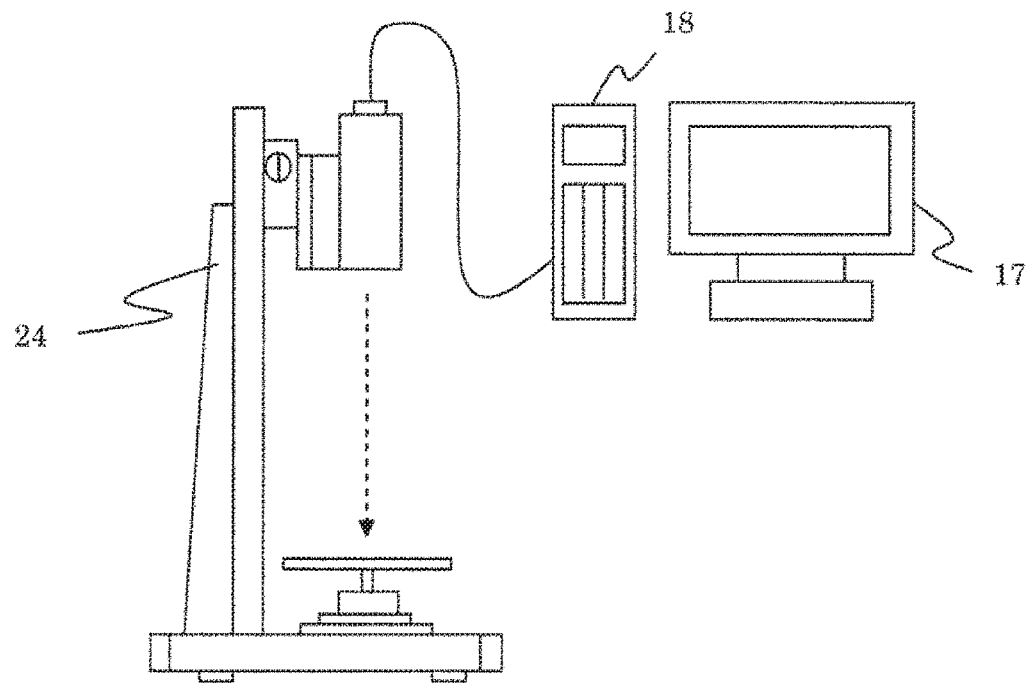
[Fig. 3]
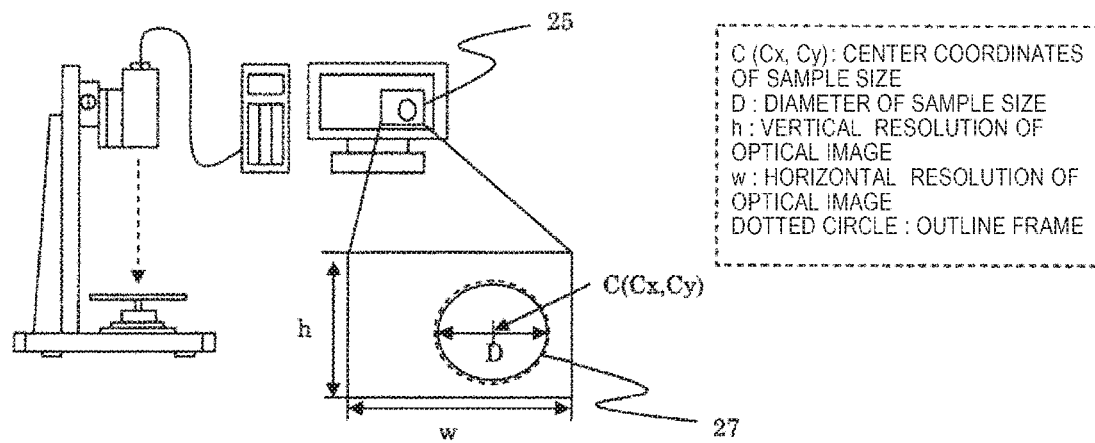
C (Cx, Cy): CENTER COORDINATES OF SAMPLE SIZE
D : DIAMETER OF SAMPLE SIZE
h : VERTICAL RESOLUTION OF OPTICAL IMAGE
w : HORIZONTAL RESOLUTION OF OPTICAL IMAGE
DOTTED CIRCLE : OUTLINE FRAME

[Fig. 4]
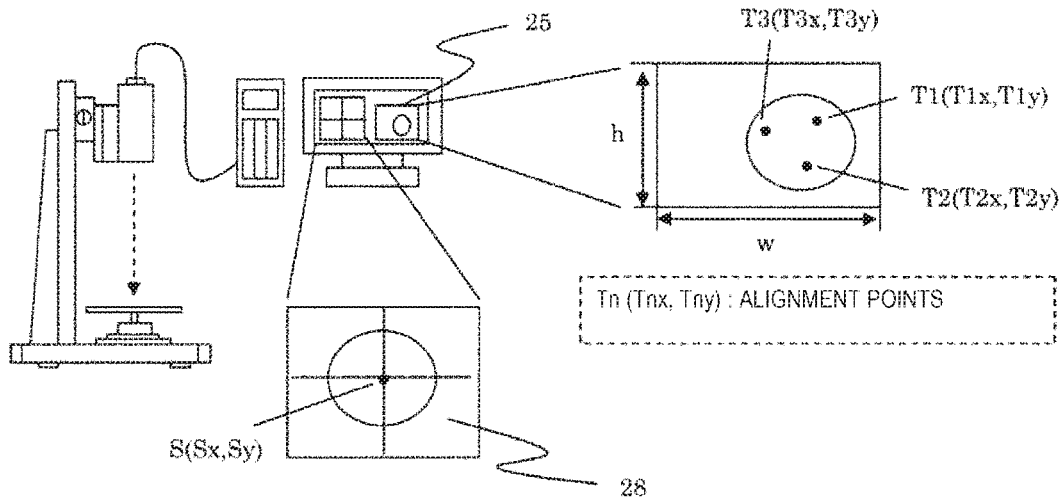
[Fig. 5]
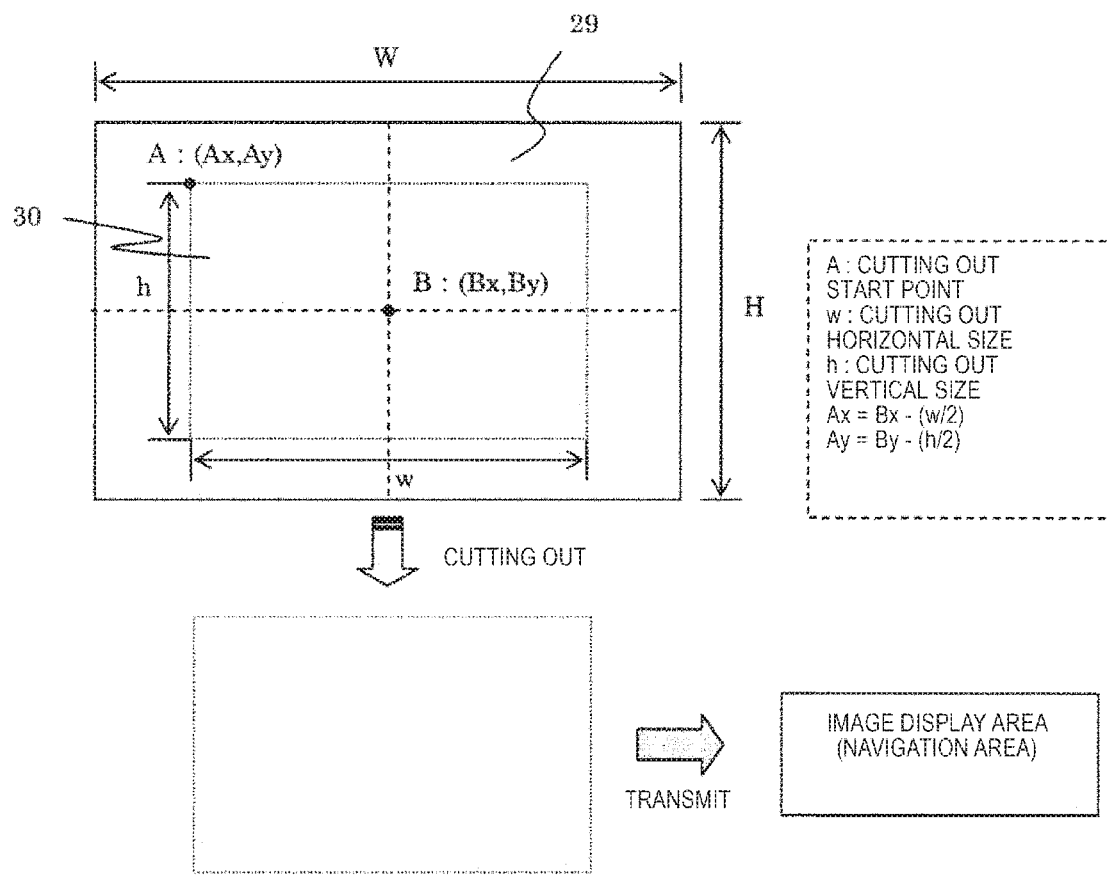

[Fig. 6]
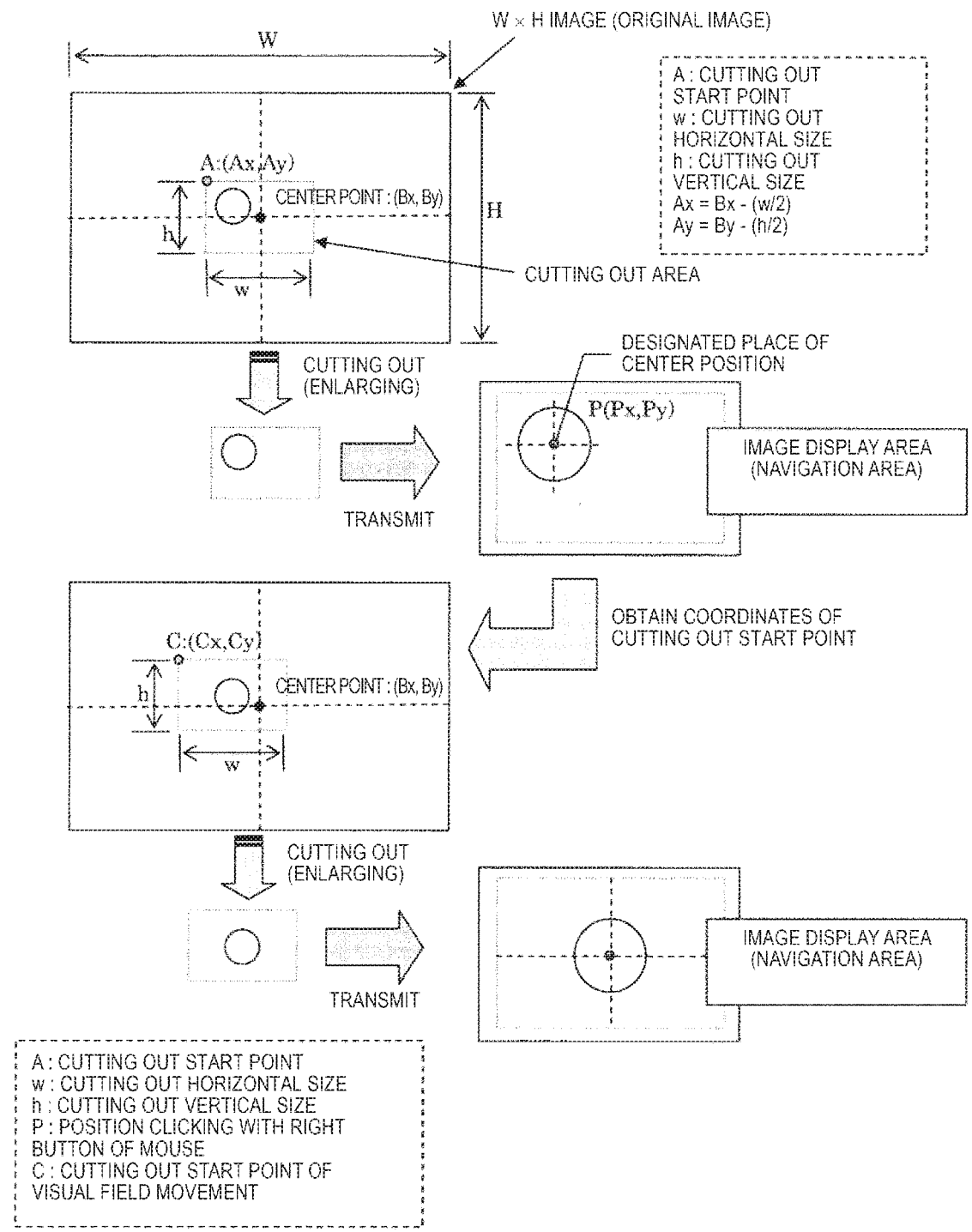

[Fig. 7]
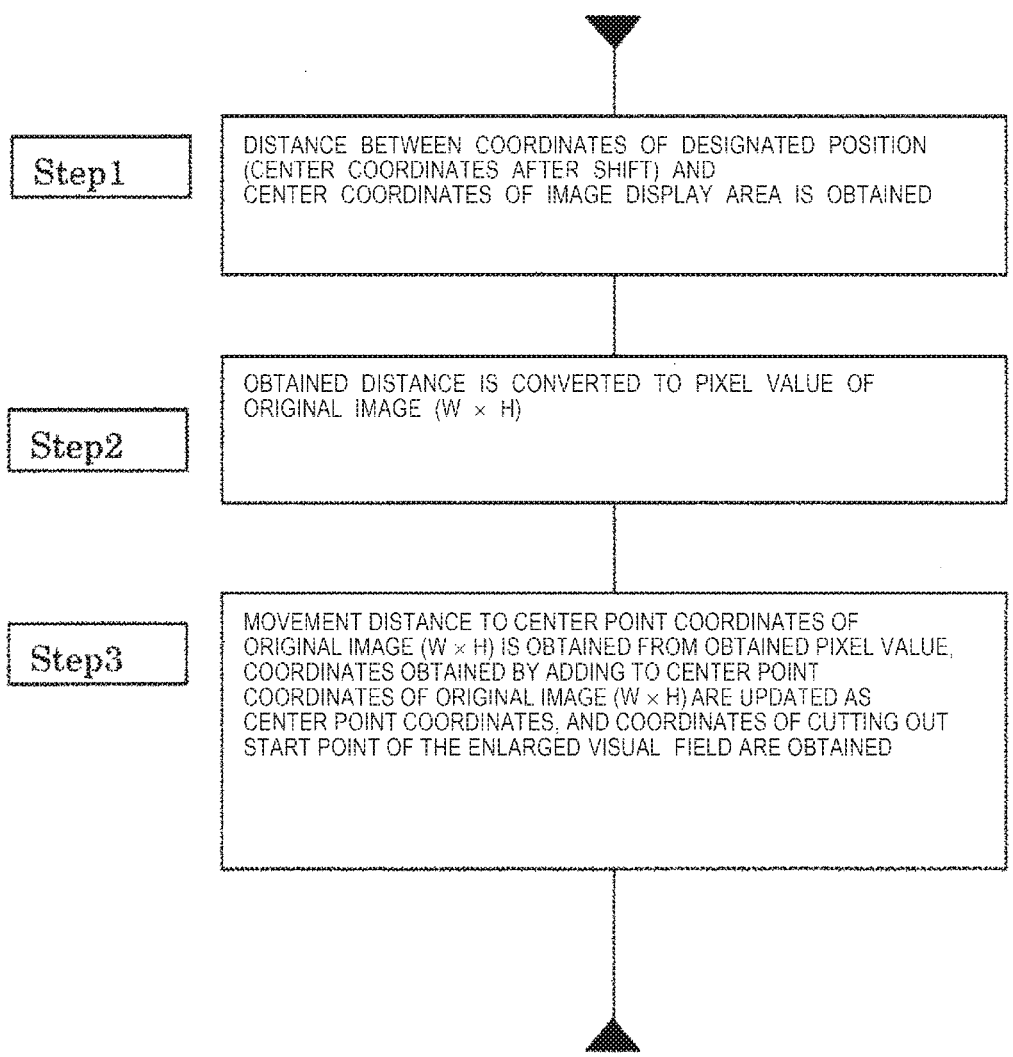

[Fig. 8]
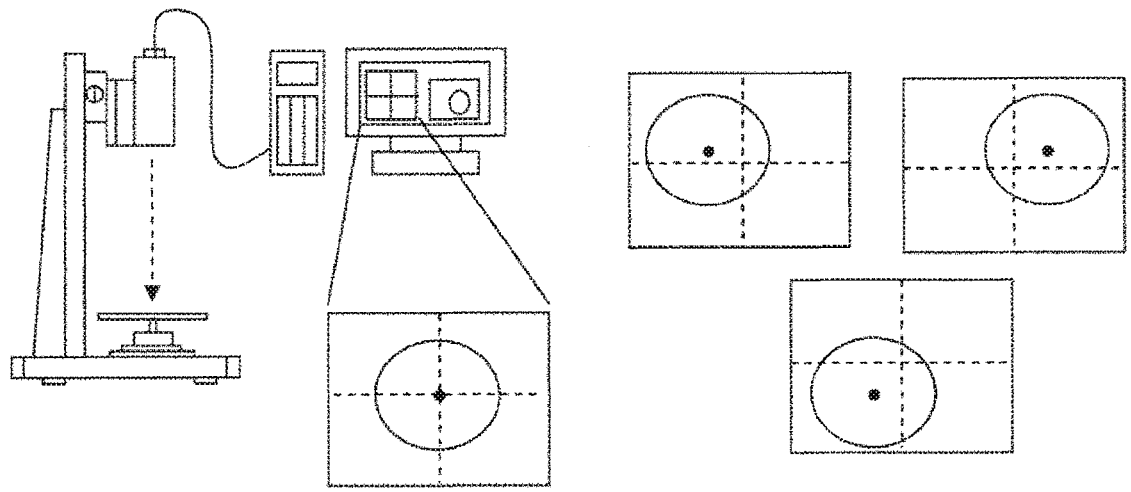
[Fig. 9]
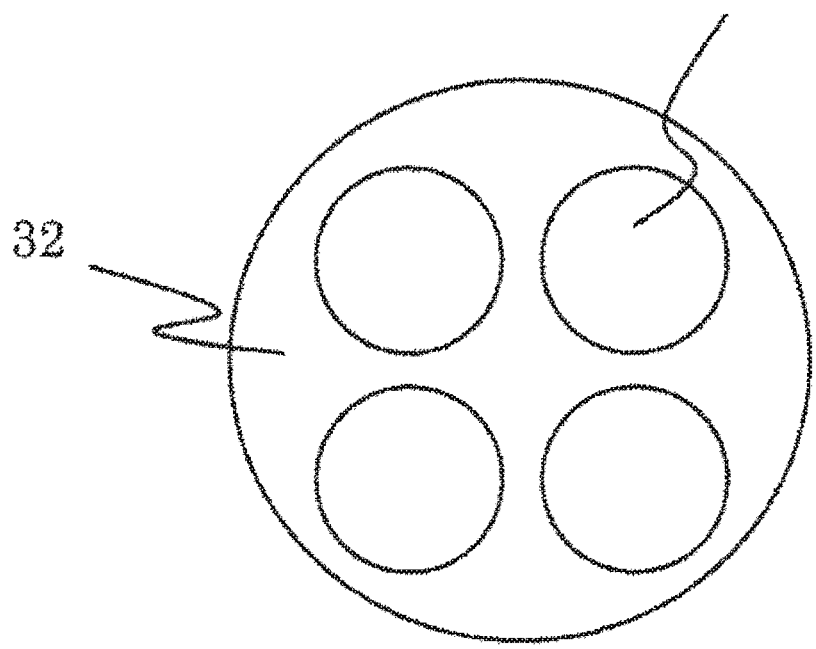

[Fig. 10]
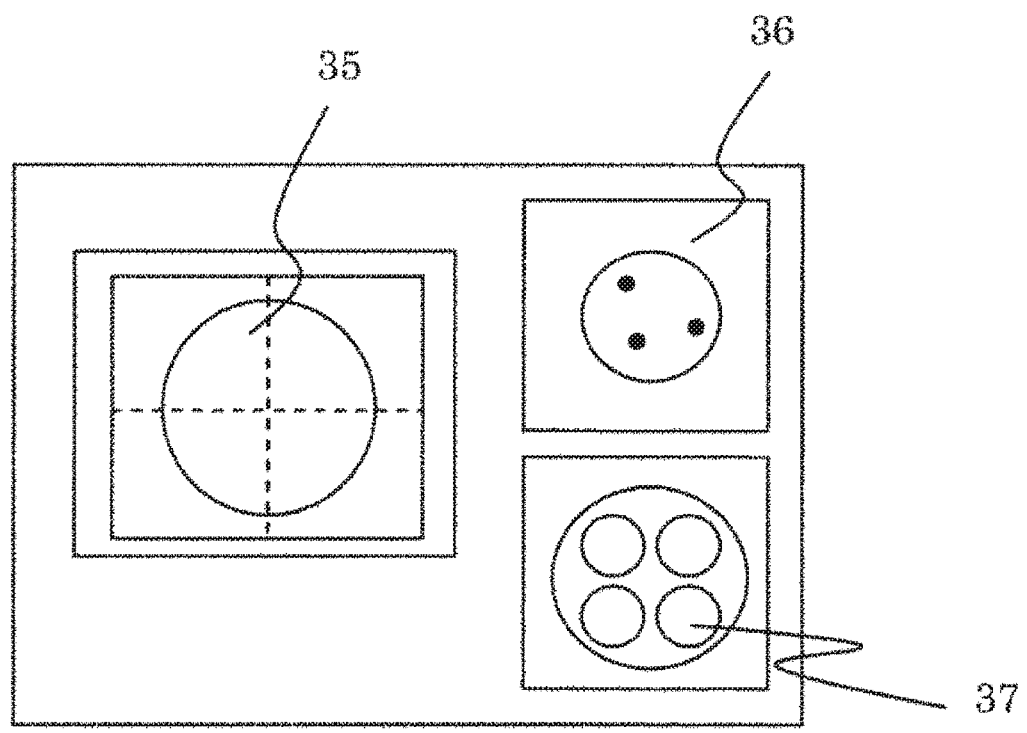

[Fig. 11]
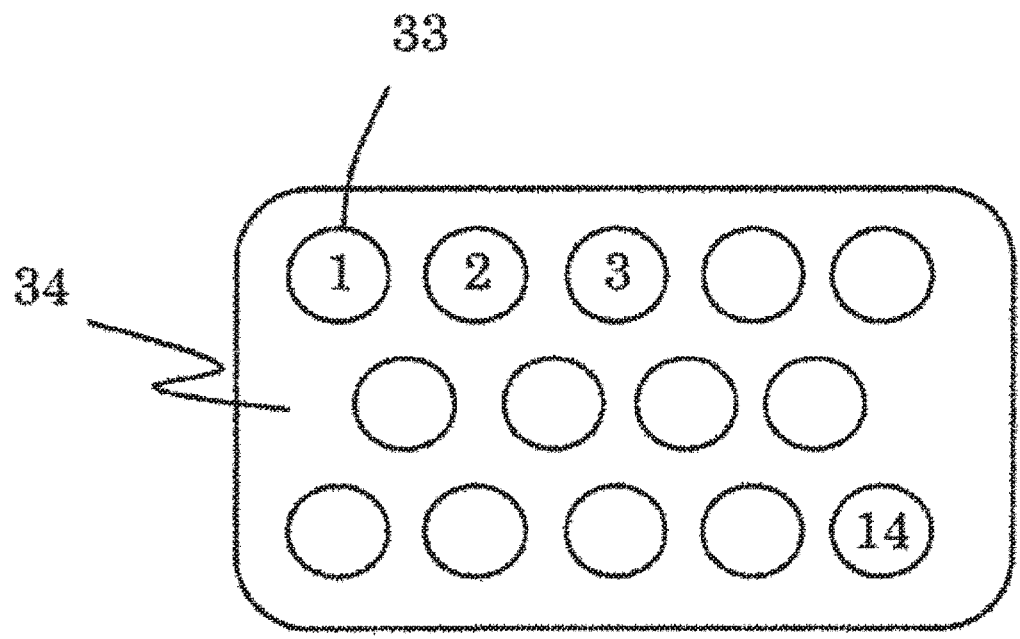

[Fig. 12]
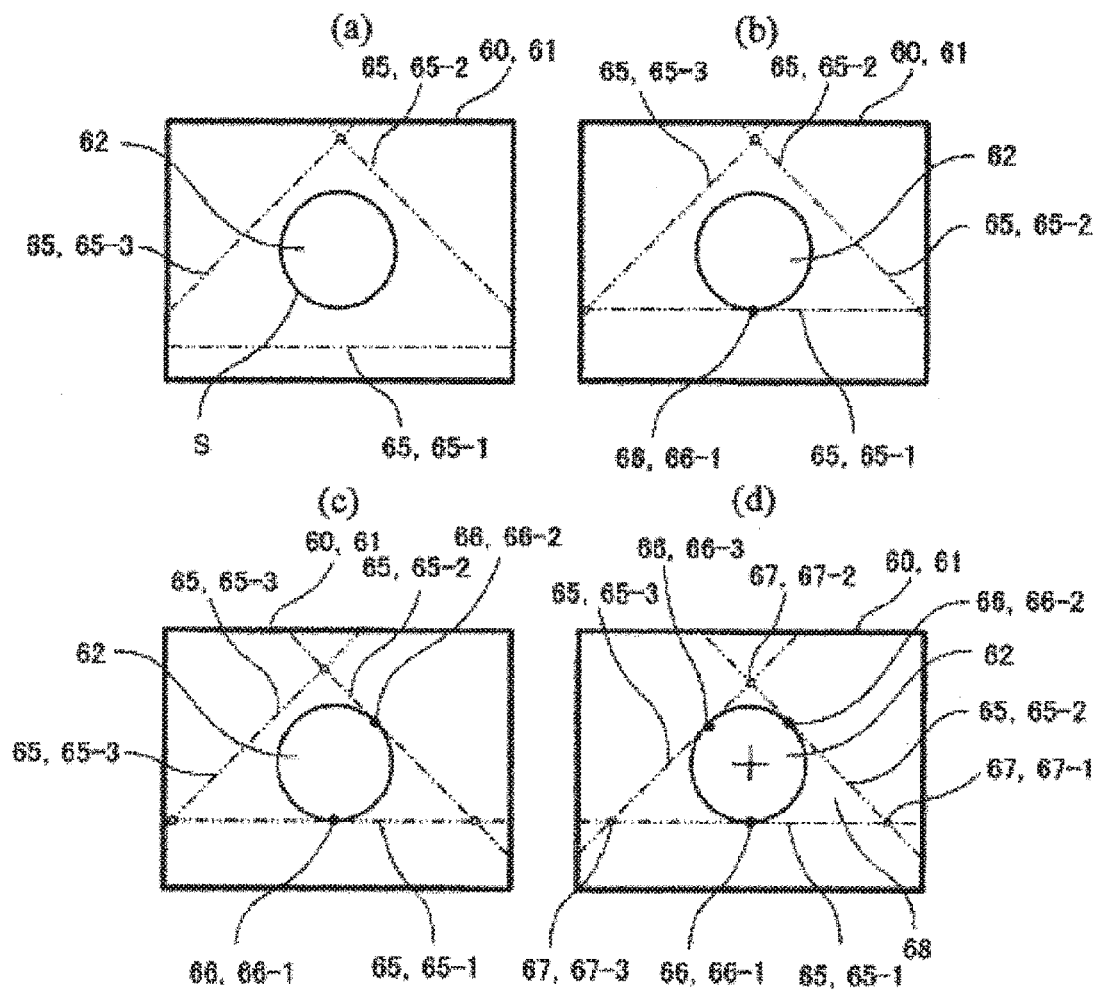

[Fig. 13]
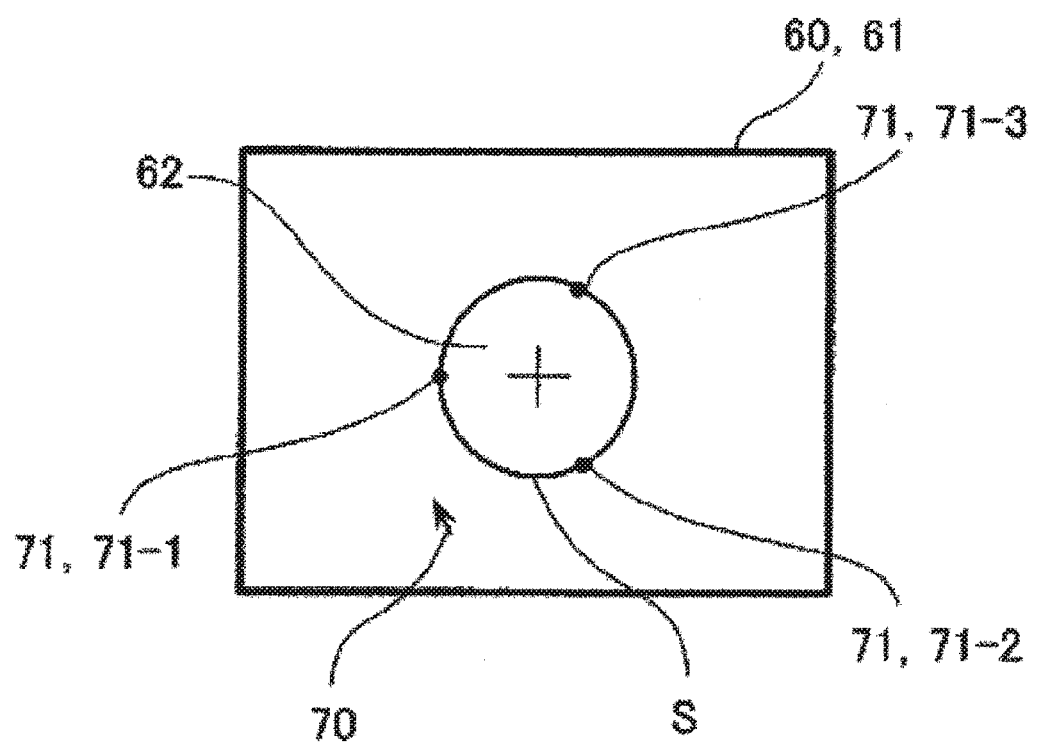

CHARGED PARTICLE BEAM APPARATUS AND ALIGNMENT ADJUSTMENT METHOD OF SAMPLE STAGE

TECHNICAL FIELD

The present invention relates to a charged particle beam apparatus such as a scanning electron microscope, and more particularly to alignment adjustment of a sample stage.

BACKGROUND ART

In a charged particle beam apparatus provided with a camera device, an optical image of a sample placed on a sample table is acquired by the camera device, and a position and a range on the sample to be observed can be selected on the optical image of the acquired sample by irradiating with a charged particle beam. In order to select the position and the range with high accuracy, it is required to adjust alignment of the optical image and a sample stage moving the sample table with high accuracy.

In JP-A-2010-198998 (PTL 1), an adjustment guide for recognizing the sample table having the same shape as the sample table in order to identify the size of the sample table in the optical image is displayed on a display screen on which the optical image of the sample table or the sample imaged by the camera device and is displayed, and on the display screen, the adjustment guide is enlarged or reduced or moved so as to coincide with the optical image of the sample table on the display screen, so that the size and center position of the sample table on the optical image are recognized. From correspondence between the recognized size of the optical image of the sample table on the display screen and the actual size of the sample table stored in advance, an enlargement magnification of the optical image acquired by the camera device and the center position of the sample table on the optical image are computed to adjust the alignment of the sample stage and the optical image.

CITATION LIST

Patent Literature

PTL 1: JP-A-2010-198998

SUMMARY OF INVENTION

Technical Problem

As a result of intensive studies on adjusting alignment of a sample stage and an optical image with high accuracy, good operability, and high throughput, the inventor of the invention has obtained the following findings.

In order to perform alignment adjustment with high accuracy, it is desirable to use not only an outer shape of a sample table (low magnification optical image) as a reference as in PTL 1, but also feature points on a sample (high magnification optical image) as a reference.

However, in a case of the alignment adjustment is performed with reference to both the outer shape of the sample table (low magnification optical image) and the feature points on the sample (high magnification optical image) by using an optical zoom camera device, since the center positions of the low magnification optical image and the high magnification optical image coincide with each other, when there are no feature points on the sample near the center of the low magnification optical image, the alignment adjustment with reference to the feature points on the sample (high magnification optical image) cannot be performed. Since the feature points on the sample are very small and it is difficult to confirm with a low magnification optical image, it is difficult to confirm the presence or absence of the feature points unless the high magnification optical image is acquired. Therefore, in a case where there are no feature points on the sample suitable for the alignment adjustment in the high magnification optical image, it is required to finely adjust the position of the camera device held by the stand or the like, or to finely adjust the position of the sample on the sample table. When the sample table holding the sample is in a sample chamber of a charged particle beam apparatus, it is required to finely adjust the sample position, reacquire the optical image, return the sample table to the sample chamber, and evacuate the sample chamber again after opening the sample chamber to the atmosphere to take out the sample table. Therefore, an operation process is complicated, and observation throughput decreases.

An object of the invention is to adjust the alignment of the sample stage and the optical image with high accuracy, good operability, and high throughput by utilizing the low magnification optical image and the high magnification optical image.

Solution to Problem

According to the invention, an alignment adjustment by a sample table alignment can be performed using a first processed optical image obtained by enlarging or reducing or changing a visual field of the optical image of the sample table holding the sample by digital processing, and an alignment adjustment by an alignment point designation can be performed using a second processed optical image different from the first processed optical image.

Advantageous Effects of Invention

According to the invention, it is possible to adjust the alignment of the sample stage and the optical image with reference to the outer shape of the sample table and the feature points on the sample without taking out the sample table holding the sample from the sample chamber.

BRIEF DESCRIPTION OF DRAWINGS

FIG. 1 is a schematic view of an overall configuration of a scanning electron microscope.

FIG. 2 is a schematic view of a camera device.

FIG. 3 is an explanatory view of alignment adjustment by sample table alignment.

FIG. 4 is an explanatory view of alignment adjustment by an alignment point designation.

FIG. 5 is an explanatory view in a case where an optical image is cut out and displayed on a GUI screen.

FIG. 6 is an explanatory view in a case of an image shift.

FIG. 7 is a flow chart obtaining center coordinates after the image shift.

FIG. 8 is an explanatory view of optical image acquisition in a case where a sample is shifted.

FIG. 9 is a schematic view of a multi holder having four sample tables.

FIG. 10 is an explanatory view of a GUI screen on a multi holder.

FIG. 11 is a schematic view of a multi holder having 14 sample tables.

FIG. 12 is an explanatory view of sample table alignment that moves and adjusts three straight lines.

FIG. 13 is an explanatory view of sample table alignment that designates three points of an outer shape of a sample table.

DESCRIPTION OF EMBODIMENTS

In the example, it is disclosed a charged particle beam apparatus including a sample stage on which a sample table holding a sample is placed and which moves at least two-dimensionally, an irradiation optical system that irradiates the sample with a charged particle beam, a detector that detects an information signal emitted from the sample, a display device that displays a charged particle image formed based on the information signal, an optical microscope that images the sample table, and a storage unit that stores an optical image imaged by the optical microscope, in which a processed optical image obtained by enlarging or reducing or changing a visual field of the optical image stored in the storage unit by digital processing is displayed on the display device, and further including an alignment adjustment unit in which an indicator for sample table alignment is displayed on a first processed optical image, and the first processed optical image or the indicator for sample table alignment is operated via an input device, so that alignment adjustment by the sample table alignment is performed, and a pointer is displayed on a second processed optical image different from the first processed optical image or the charged particle image, and the second processed optical image or the charged particle image or the pointer is operated via the input device, so that alignment adjustment by alignment point designation is performed.

In addition, in the example, it is disclosed an alignment adjustment method including storing an optical image of a sample table holding a sample imaged by an optical microscope on a storage unit of a charged particle beam apparatus, displaying a first processed optical image obtained by enlarging or reducing or changing a visual field of the optical image stored in the storage unit by digital processing on a display device of the charged particle beam apparatus, displaying an indicator for sample table alignment on the first processed optical image, and operating the first processed optical image or the indicator for sample table alignment via an input device, so that alignment adjustment by the sample table alignment is performed, displaying a second processed optical image different from the first processed optical image obtained by enlarging or reducing or changing a visual field of the optical image stored in the storage unit by digital processing on the display device, irradiating the sample held by the sample table placed on a sample stage that moves at least two-dimensionally with a charged particle beam from an irradiation optical system, detecting an information signal emitted from the sample by a detector, and displaying a charged particle image formed based on the information signal on the display device, and displaying a pointer on the second processed optical image different from the first processed optical image or the charged particle image, operating the second processed optical image or the charged particle image or the pointer via the input device, so that alignment adjustment by alignment point designation is performed.

In addition, in the example, it is disclosed that the second processed optical image which is enlarged more than the first processed optical image is displayed on the display device after the alignment adjustment by the sample table alignment is performed, and the alignment adjustment by the alignment point designation may be performed.

In addition, in the example, it is disclosed that the indicator for sample table alignment has a shape obtained by imitating a contour of the sample table placed on the sample stage, or is a pointer that enables coordinates of a contour point of the sample table displayed on the first processed optical image to be input.

In addition, in the example, it is disclosed that in a case where a plurality of sample tables are placed on the sample stage, the alignment adjustment unit may perform the alignment adjustment by the sample table alignment and the alignment adjustment by the alignment point designation for each sample table.

In addition, in the example, it is disclosed that in a case where a predetermined sample table among the plurality of sample tables is selected via the input device, the sample stage moves at least two-dimensionally based on the alignment adjustment of the sample table.

In addition, in the example, it is disclosed that the alignment adjustment unit supports alignment adjustment of another sample table based on alignment adjustment of a certain sample table.

Hereinafter, the above and other novel features and effects of the invention will be described with reference to the drawings. In the example, a scanning electron microscope (SEM) will be described as an example of the charged particle beam apparatus, and in addition to SEM, the invention may be applied to general charged particle beam apparatuses usable for measurement, inspection, and processing such as an appearance inspection apparatus, a focused ion beam apparatus, or an ion microscope.

EXAMPLE 1

FIG. 1 is a schematic diagram of an overall configuration of a scanning electron microscope (SEM). The SEM of the example is roughly configured to include an electron optical lens tube 23, a sample chamber 12, and other control systems.

First, the electron optical lens tube 23 will be described. A primary electron beam 4 emitted from an electron gun 1 is controlled and accelerated by an anode 2. A sample 8 existing on a sample stage 9 is converged and irradiated with the primary electron beam 4 by a condenser lens 3 and an objective lens 6. A deflector 5 is provided on a path of the primary electron beam 4. To the deflector 5, a predetermined deflection current is supplied from a deflection control unit 10 according to a predetermined set magnification. As a result, the primary electron beam 4 is deflected to two-dimensionally scan a front surface of the sample. A secondary electron 7 generated by irradiating the sample with the electron beam are detected by a secondary electron detector 13 and amplified by an amplifier 14. An information signal is converted into a digital signal and thereafter stored as image data in an image storage unit 15 such as a frame memory. The image signal at this time is displayed on a monitor 17 such as a CRT or an LCD.

In addition to the secondary electron, information signals such as a reflected electron, a transmitted electron, characteristic X-ray, or excitation light may be detected by a predetermined detector and imaged.

The sample stage 9 is driven by five axes of three-dimensional movement (X·Y·Z), inclination (T) and rotation (R). The sample 8 is placed on the sample table stored in the sample chamber 12. The sample table can be freely moved within the XY plane by the sample stage 9. A movement of a visual field of the SEM to an alignment point is performed by a movement of the sample stage 9. The sample stage 9 is controlled by a stage control unit 11, so that the sample stage 9 is positioned at an arbitrary position.

Various operation conditions of the electron optical lens tube 23 are controlled by a main control unit 16 (SEM control unit). In addition, a computer 18 that plays a role of a management console of the SEM is connected to the main control unit 16. A GUI screen for setting the operation condition of the electron optical lens tube 23 is displayed on the monitor 17. The device user operates an input device such as a mouse 20 or a keyboard 21 connected to the computer 18 to set the operation condition of the SEM on the GUI screen. The operation condition setting of the SEM can be executed without using the GUI screen by using an exclusive operation panel 22.

FIG. 2 is a schematic diagram of a camera device, and illustrates a configuration of a camera device 24. The camera device 24 is disposed on a post portion standing on an attachment portion on which the sample table can be placed, so that the optical camera faces downward so as to face the attachment portion. The camera device 24 displays the optical image acquired at a single focus lens point on the monitor 17 via the computer 18. A storage medium 19 (database) is provided with a secondary storage device such as a nonvolatile memory and a hard disk, and stores and manages information on optical image data and alignment data acquired by the camera device 24.

The optical camera may be placed in the sample chamber 12 and the sample table placed on the sample stage 9 may be imaged.

For SEM image observation, there is a demand to grasp which position is to be observed for the whole sample. As one method of satisfying the demand, there is a method of selecting the position and range on the sample for observing the SEM image on the optical image by using the alignment between the SEM image and the optical image. In order to do the method, it is required to adjust the sample stage (SEM image) and the alignment adjustment of the optical image (calibration).

FIG. 3 is an explanatory view of alignment adjustment by sample table alignment. In the sample table alignment, the outer shape of the sample table is imaged by the camera device 24 to acquire an optical image. The acquired optical image 25 is displayed on the monitor 17 via the computer 18. At the start of sample table alignment, a dotted circle 27 imitating the outer shape of the sample table is displayed on the monitor 17. The input device is operated, and the dotted circle 27 is enlarged or reduced or moved and aligned so as to overlap with the outer shape of the sample table. As a result, the computer 18 recognizes the size (D) and center position (C (Cx and Cy)) of the sample table on the optical image 25. From the actual size of the sample table (for example, diameter 15 mm) and the vertical and horizontal resolution (h and w, respectively) of the monitor 17 stored on the storage medium 19 as known, a correct magnification of the optical image 25 and a movement amount of the sample stage corresponding to one pixel of the monitor 17 are obtained.

Not limited to the dotted circle, a dotted line such as a square or a rectangle may be displayed in accordance with the sample table mounted on the sample stage 9. In addition, the alignment adjustment may be performed by zooming the optical image and shifting the image, without moving the dotted circle or in accordance with the operation of dotted circle.

FIG. 4 is an explanatory view of the alignment adjustment by the alignment point designation. In the alignment point designation, the sample is imaged by the camera device 24 to acquire the optical image. Thereafter, the sample table holding the sample is placed on the sample stage to acquire the SEM image of the sample. The acquired optical image 25 and the SEM image 28 are displayed side by side on the monitor 17 via the computer 18. A device user uses a characteristic portion on the sample which can be recognized in both the acquired optical image 25 and the SEM image 28 as an alignment point. The pointer is moved to designate an alignment point (for example, T1 (T1x and T1y)) on the optical image 25, and thereafter an alignment point (for example, S (Sx and Sy)) on the SEM image 28 corresponding thereto is designated and associated. For example, three alignment points are designated ((first point: T1 (T1x and T1y), second point: T2 (T2x and T2y), and third point: T3 (T3x and T3y)). As a result, the computer 18 recognizes the distance between the alignment points on the optical image 25 and the distance on the stage coordinates between the alignment points on the SEM image 28 corresponding thereto. From these relationships, the movement amount of the sample stage corresponding to one pixel can be obtained.

Here, the image obtained by zooming and image shifting the optical image 25 used for the sample table alignment is used for the alignment point designation, so that the alignment is adjusted with reference to both the outer shape of the sample table and the feature points on the sample without taking out the sample table holding the sample from the sample chamber. When both the sample table alignment and the alignment point designation are completed, since the stage movement amount at one pixel in each of the low magnification optical image and the high magnification optical image is determined, an optical image for navigation is created by enlarging, reducing or synthesizing the low magnification optical image or the high magnification optical image obtained the adjustment data in accordance with the magnification of the optical image for navigation designated by the device user, and the position and range on the sample for observing the SEM image are selected based on the optical image, so that the stage is moved. It is possible to perform the alignment adjustment by selectively performing the sample table alignment and the alignment point designation.

FIG. 5 is an explanatory view in a case where an optical image is cut out and displayed on a GUI screen, and illustrates a method of zooming and reducing the optical image acquired by the camera device 24.

Normally, the optical image acquired by the camera device 24 is handled as having a magnification of 1. The vertical and horizontal resolutions of the acquired optical image are set to as H·W, respectively. In a case where the point B (Bx and By) is the zoom center, when the vertical and horizontal resolutions after cutting out is h·w, respectively, the cutting out start point (coordinates point A at left end after zooming (Ax and Ay)) can be represented by $$Ax=Bx-(w/2)$$

$$Ay=By-(h/2).$$

The cutting out area obtained here is displayed as a navigation area on the GUI screen. In this manner, zooming and reducing is performed at the ratio between the resolution (reference image) acquired by the camera device 24 and the area displayed on the GUI screen.

The zooming step is a size cut out so as to maintain the vertical and horizontal resolutions. For example, in a case where an aspect ratio of the image display area is 4:3 and the vertical and horizontal resolutions are 1,280 horizontal and 960 vertical, respectively, Cutting out horizontal size=horizontal resolution−cutting out multiple×4

Cutting out vertical size=cutting out horizontal size× ¾.

In this case, the cutting out multiple is defined as 1 in a case of cutting off with 4 pixels horizontally and 3 pixels vertically. The cutting out multiple is defined as 2 in a case of cutting off with 8 (4×2) pixels horizontally and 6 (3×2) pixels vertically.

In addition, the zoom magnification at this time is

Magnification=horizontal resolution/cutting out horizontal size (=vertical resolution/cutting out vertical size).

FIG. 6 is an explanatory view in a case of an image shift, and illustrates a method of moving a zoom visual field. A movement of the zoom visual field is performed by calculating the movement distance from the position at which the visual field on the image display area is to be moved and the center coordinates of the original image and obtaining the cutting out start point coordinates.

First, the image of the original image W×H is zoomed around the center point coordinates (Bx×By). The cutting out area is displayed on the image display area (navigation area) of the GUI screen. Next, the center position desired to be the center of the zoom visual field is designated on the image display area. The designation method is, for example, a mouse or the like. The center position is set to be P (Px and Py). In order to display (image shift) the designated center position at the center of the image display area, conversion to the original image is performed once. The image shift processing is as follows.

FIG. 7 is a flow chart obtaining center coordinates after the image shift. As step 1, the distance between the coordinates of the designated center position (center coordinates after the image shift) and the center coordinates of the image display area is obtained. In step 2, since the zoom magnification does not change, the obtained distance is converted to the pixel value of the original image W×H. Finally, as step 3, a distance to the center point coordinates of the original image W×H is obtained from the obtained pixel value, the coordinates obtained by adding the distance to the center point coordinates of the original image W×H are updated as new center point coordinates, and the coordinates of the cutting out start point after the movement of the zoom visual field are obtained. In this manner, the shift distance (offset) on the zoomed image is added to the center point coordinates of the original image and the image is further displayed on the image display area at the original zoom magnification, so that the image is shifted.

When the image shift is possible, in a case of zooming in order to adjust the alignment more accurately, the zoom center shifts from the alignment point, and even when the alignment point shifts from the zoom visual field, the alignment point can be displayed on the image display area and the adjustment by the alignment point designation can be performed.

FIG. 8 is an explanatory view of optical image acquisition in a case where a sample is shifted. The center of the optical image acquired by the camera device may significantly shift from the center of the sample in some cases. Since the optical zoom is magnified with reference to the center of the optical image, when the center is significantly shifted from the center of the sample and the optical zoom is performed, the center of the sample shifts from the zoom visual field. In this state, a feature point in a vicinity of the center of the sample cannot be designated as the alignment point. By shifting the image, since the vicinity of the center of the sample is displayed in the zoom visual field, it is possible to designate a feature point in the vicinity of the center of the sample as an alignment point and continue to observe the SEM image as it is in a state where the sample is placed in the sample chamber.

According to the example, the zoom processing by cutting out an image is performed with respect to an optical image acquired from the camera device, so that operability equivalent to a camera device having a zoom function is satisfied. Furthermore, the image shift processing is performed using the cutting out portion, so that the zoom processing is performed with reference to the center of the sample even when a positional shift of the camera device occurs.

According to the example, the zoom processing and the image shift processing are applied to the optical image, so that the acquired optical image with a certain position is enlarged as the zoom center. Therefore, it is found that the zoom center is shifted after starting the observation of the electron microscope by placing the sample in the sample chamber, and the observation can be smoothly performed without taking out the sample from the sample chamber even in a case where it is desired to revise the optical image. Therefore, the throughput in a series of operations for observing the electron microscope image is improved. In particular, it is possible to reliably perform the sample table alignment with reference to the outer shape of the sample table in a low magnification optical image and the alignment point designation with reference to the feature points on the sample in a high magnification optical image by using the same optical image.

EXAMPLE 2

In the example, in a multi holder having a plurality of sample tables, a case will be described where a sample table alignment and an alignment point designation are respectively performed for each sample table, alignment data is recorded, and alignment is adjusted in accordance with a sample table selected by the GUI. Hereinafter, differences from Example 1 will be mainly described.

FIG. 9 illustrates a schematic view of a multi holder having four sample tables. In a circular multi holder 32, four sample tables 31 are held in two rows and two columns. On each of the sample tables 31, samples are held, respectively. Information such as the size of the multi holder 32 disposed in the scanning electron microscope, the number of sample tables, the center position of each sample table, the size of each sample table, the sample held on each sample table, and the like is stored in the database of the scanning electron microscope.

FIG. 10 illustrates an explanatory view of a GUI screen on a multi holder. A display area 35 of the SEM image is provided on the left side of the GUI screen, a display area 36 of the optical image is provided on the right upper portion, and an operation area 37 of the multi holder is provided on the right lower portion. An operation image imitating the multi holder disposed on the scanning electron microscope is displayed on the operation area 37 of the multi holder, and the mode is shifted to a mode for operating the sample table by clicking on the part corresponding to the sample table with a mouse. An SEM image and an optical image on the sample table are respectively displayed on the display area 35 of the SEM image and the display area 36 of the optical image.

The alignment adjustment between the SEM image and the optical image is performed as follows. An optical image of the multi holder is acquired by the camera device, after the sample is placed on each sample table of the multi holder. Thereafter, the multi holder is placed in the sample chamber and evacuated to be a state where the SEM observation is possible. When the sample table is selected by the operation area 37 of the multi holder, the start of sample table alignment is selected, and the dotted circle displayed on the display area 36 of the optical image is enlarged or reduced or moved, and is coincided with the optical image of the sample table, so that the sample table alignment is performed. Next, start of the alignment point designation is selected, and the optical image displayed on the display area 36 of the optical image is zoomed or shifted to display a characteristic portion on the sample. In addition, the same portion on the sample is displayed on the display area 35 of the SEM image. The alignment point designation is performed by clicking the feature points on each image with the mouse. The alignment point designation is performed a predetermined number of times (for example, three times), and the alignment point designation is ended. As a result, the sample table alignment and the alignment point designation for the selected sample table are completed, and the adjustment data is stored in a database in association with the selected sample table. The optical image and the SEM image used for the alignment adjustment and observation conditions such as an accelerating voltage and a stage coordinates are associated with each other and stored in the database. Either the sample table alignment or the alignment point designation is performed, so that the alignment adjustment is performed.

Next, another sample table is selected by the operation area 37 of the multi holder, and thereafter sample table alignment and alignment point designation are performed in the same manner, and the adjustment data is stored in the database. When this series of operations is performed for all sample tables, the alignment adjustment for multi holder is completed.

In a case where the multi holder installed in the scanning electron microscope is a known multi holder, the optical image and the SEM image of the sample table selected by the operation area 37 of the multi holder are displayed on the display area 36 of the optical image and the display area 35 of the SEM image in a visual field where alignment is easy to adjust (observation position and magnification) based on information such as the size of the multi holder stored in the database, the number of sample tables, the center position of each sample table, and the size of each sample table. Since it is possible to significantly eliminate troubles of enlarging or reducing or moving the dotted circle, zooming and image shifting of the optical image, searching the visual field of the SEM image, the alignment adjustment of each sample table can be efficiently performed. Furthermore, after the alignment adjustment is completed for a part of the sample tables, the visual field of the optical image and the SEM image of the sample table selected by the operation area 37 of the multi holder is provisionally set using the data, so that the alignment adjustment of the remaining sample tables is performed more and more efficiently as the alignment adjustment for a part of the sample tables is completed.

In the SEM observation, the adjustment data is read from the database in accordance with the sample table selected by the operation area 37 of the multi holder, and the optical image and the SEM image are displayed on the display area 36 of the optical image and the display area 35 of the SEM image after the alignment adjustment is performed. The SEM image of the position is displayed with high accuracy on the display area 35 of the SEM image by clicking a desired position in the display area 36 of the optical image with a mouse or the like.

The multi holder subjected to the alignment adjustment once can be observed without adjusting the alignment by reading the observation conditions such as an acceleration voltage at the time of alignment adjustment in addition to the adjustment data from the database. Even the multi holder once taken out from the sample chamber can be observed quickly after realignment in the sample chamber.

In addition, FIG. 11 illustrates a schematic diagram of a multi holder having 14 sample tables. In the substantially rectangular multi holder 34, 14 sample tables 33 are held divided into three rows. There are five sample tables 33 in the first and third rows and four sample tables 33 in the second row, and numbers are allocated from the upper left to the lower right. In this manner, multi holders having various forms can be used as the multi holder.

According to the example, a throughput when observing a plurality of samples held by the multi holder with an electron microscope is improved. In particular, the sample table alignment and the alignment point designation of each sample table can be efficiently performed without re-taking the optical image outside the sample chamber. In addition, it is possible to further improve the operability by interlocking with a navigation function or the like in which the stage (visual field of SEM image) moves to the position designated on the optical image.

EXAMPLE 3

In the example, sample table alignment that moves and adjusts three straight lines instead of the circle will be described. Hereinafter, differences from Examples 1 and 2 will be mainly described.

FIG. 12 is an explanatory view of the sample table alignment that moves and adjusts three straight lines. In the sample table alignment according to the example, three known linear guide lines 65 (65-1, 65-2, and 65-3) having different inclinations viewed on the coordinates of the optical image are superimposed and displayed as illustrated in FIG. 12(a). Therefore, when these three linear guide lines 65-1, 65-2, and 65-3 are appropriately moved in parallel on the GUI screen 60, a plurality of similar shaped triangles 68 having intersection points 67 (67-1, 67-2, and 67-3) between two different linear guide lines of different combinations as a vertex can be formed on the GUI screen 60, that is, on the optical image 61.

The size and the center position of a sample table image 62 on the optical image and an imaging magnification of the optical image 61 including the sample table image 62 can be automatically acquired with high accuracy and rapidly by a simple calculation from the coordinates of each intersection point 67 (67-1, 67-2, and 67-3) serving as each vertex of the triangle.

As illustrated in FIG. 12, it is preferable that the inclination of each linear guide line 65 is determined so that the three linear guide lines 65 (65-1, 65-2, and 65-3) are points which divide the circular contour S of the sample table image 62 into approximately three. As a result, regardless of the user, since outer contact points 66 (66-1, 66-2, and 66-3) which divide the circular contour S into approximately three along the length direction serves as a reference for acquiring a measurement reference point, it is possible to acquire the imaging magnification with high accuracy.

EXAMPLE 4

In the example, sample table alignment that designates three points of an outer shape of a sample table, instead of fitting the circle to the outer shape of the sample table will be described. Hereinafter, differences from Examples 1 to 3 will be mainly described.

FIG. 13 is an explanatory view of the sample table alignment that designates three points of the outer shape of the sample table. In the sample table alignment according to the example, a pointer 70 freely movable on the GUI screen is displayed on the GUI screen by an operation of a mouse or the like. For example, on the optical image 61 including a sample table image having the contour S such as a circle, a rectangle, a parallelogram, and a regular polygon, a plurality of points are directly set as measurement reference points on the contour of the sample table image 62 by moving the pointer 70 onto the contour shape S and dropping the pointer 70.

According to the example, the size and the center position of a sample table image on the optical image and an imaging magnification of the optical image 61 including the sample table image can be automatically acquired with less man-hours and rapidly by a simple calculation by calculating the center from the coordinates of each contour point 71 (71-1, 71-2, and 71-3) on a predetermined contour shape such as a circle, a rectangle, a parallelogram or a regular polygon.

REFERENCE SIGNS LIST

1 Electron gun
2 Anode
3 Condenser lens
4 Primary electron beam
5 Deflector
6 Objective lens
7 Secondary electron
8 Sample
9 Sample stage
10 Deflection control unit
11 Stage control unit
12 Sample chamber
13 Secondary electron detector
14 Amplifier
15 Image storage unit
16 Main control unit
17 Monitor
18 Computer
19 Storage medium
20 Mouse
21 Keyboard
22 Exclusive operation panel
23 Electron optical lens tube
24 Camera device
25 Optical image
27 Dotted circle
28 SEM image
31 Sample table
32 Multi holder
33 Sample table
34 Multi holder
35 Display area of SEM image
36 Display area of optical image
37 Operation area of multi holder
60 GUI screen
61 Optical image
62 Sample table image
65 Linear guide line
66 Contact point
67 Intersection point
68 Triangle
70 Pointer
71 Contour point

The invention claimed is:

1. A charged particle beam apparatus comprising:
a movable stage on which a sample table capable of holding a sample is placed;
an irradiation optical system that irradiates the sample with a charged particle beam;
a detector that detects a signal emitted from the sample;
a display device that displays a charged particle image formed based on the signal;
an optical microscope configured to obtain an optical image of the sample table; and
a processor configured to control movement of the moveable stage to perform alignment of the sample table based on (i) a first processed optical image at a first magnification of the optical image of the sample table and (ii) a second processed optical image at a second magnification of the optical image of the sample table by aligning a visual display of the sample table with the second processed optical image using an alignment point designation with respect to a plurality of feature points on the sample as an alignment point,
wherein the second magnification is higher than the first magnification,
wherein the first processed optical image based on the first magnification of the optical image obtained by imaging the sample table using the optical microscope includes an indicator for sample table alignment with respect to an outer shape of the sample table, said first processed optical image being obtained by zooming and/or shifting the optical image of the sample table imaged by the optical microscope, and
wherein the processor is configured to perform a first alignment adjustment of the sample table by aligning the visual display of the sample stage with said first processed optical image using the indicator with respect to the outer shape of the sample table as another alignment point, and to perform a second alignment adjustment of the sample table based on the alignment point designation of said second processed optical image by zooming and/or shifting the optical image of the sample table obtained by imaging the sample table using the optical microscope and on the charged particle image, such that the processor performs the alignment of the sample table with respect to the indicator by aligning the visual display of the sample stage with said first processed optical image at said first magnification and with respect to said alignment point designation of said second processed optical image at said second magnification so that the alignment of the sample table with respect to the first processed optical image is adjusted with reference to both the outer shape of the sample table and the feature points on the sample.

2. The charged particle beam apparatus according to claim 1, wherein the second alignment adjustment is performed after the first alignment adjustment is performed.

3. The charged particle beam apparatus according to claim 1, wherein the first and/or the second processed optical image is formed by zooming the optical image imaged by the optical microscope and thereafter shifting the zoomed image.

4. The charged particle beam apparatus according to claim 1, wherein in a case where a plurality of sample tables are placed on the stage, the first and/or the second alignment adjustment is performed for each sample table.

5. The charged particle beam apparatus according to claim 4, wherein in a case where a predetermined sample table among the plurality of sample tables is selected, the stage moves based on the first and/or second alignment adjustment of the sample table.

6. An alignment adjustment method in a charged particle beam apparatus that includes a movable stage on which a sample table capable of holding a sample is placed, an irradiation optical system that irradiates the sample with a charged particle beam, a detector that detects a signal emitted from the sample, a display device that displays a charged particle image formed based on the signal, and an optical microscope that images the sample table, the method comprising:

displaying an indicator for sample table alignment with respect to an outer shape of the sample table on a first processed optical image, the first processed optical image being obtained by zooming and/or shifting an optical image imaged by the optical microscope;

performing a first alignment adjustment of the sample table with respect to the first processed optical image using the indicator of the first processed optical image as an alignment point;

displaying an alignment point designation on a second processed optical image obtained by zooming and/or shifting the optical image obtained by imaging the sample table using the optical microscope and on the charged particle image; and performing a second alignment adjustment of the sample table by aligning a visual display of the sample table with the second processed optical image using the alignment point designation on the second processed optical image as another alignment point so that the alignment of the sample table with respect to the first processed optical image is adjusted with reference to both the outer shape of the sample table and a plurality of feature points on the sample.

7. The alignment adjustment method according to claim 6, wherein the second alignment adjustment is performed after the first alignment adjustment is performed.

8. The alignment adjustment method according to claim 6, wherein the first and/or the second processed optical image is formed by zooming the optical image imaged by the optical microscope and thereafter shifting the zoomed image.

9. The alignment adjustment method according to claim 6, wherein in a case where a plurality of sample tables are placed on the stage, the first and/or second alignment adjustment is performed for each sample table.

10. The alignment adjustment method according to claim 9, wherein in a case where a predetermined sample table among the plurality of sample tables is selected, the stage moves based on the first and/or second alignment adjustment of the sample table.

* * * * *